United States Patent
Fu et al.

(10) Patent No.: US 9,245,073 B2
(45) Date of Patent: Jan. 26, 2016

(54) PATTERN DENSITY-DEPENDENT MISMATCH MODELING FLOW

(71) Applicant: TAIWAN SEMICONDUCTOR MANUFACTURING COMPANY LTD., Hsinchu (TW)

(72) Inventors: Chung-Min Fu, Taoyuan County (TW); Wan-Yu Lo, Taoyuan County (TW); Shih-Cheng Yang, Hsinchu County (TW); Chung-Kai Lin, Taipei (TW); Yung-Chow Peng, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 60 days.

(21) Appl. No.: 14/182,852

(22) Filed: Feb. 18, 2014

(65) Prior Publication Data
US 2015/0234964 A1    Aug. 20, 2015

(51) Int. Cl.
*G06F 9/45* (2006.01)
*G06F 17/50* (2006.01)

(52) U.S. Cl.
CPC ........ *G06F 17/5045* (2013.01); *G06F 17/5022* (2013.01)

(58) Field of Classification Search
USPC .......................... 716/103, 105, 106, 107, 111
See application file for complete search history.

(56) References Cited

U.S. PATENT DOCUMENTS

| | | | |
|---|---|---|---|
| 7,235,424 B2 * | 6/2007 | Chen et al. ..................... | 438/107 |
| 2008/0066025 A1 * | 3/2008 | Tanaka .............................. | 716/4 |
| 2015/0026657 A1 * | 1/2015 | Fu et al. ......................... | 716/136 |

* cited by examiner

*Primary Examiner* — Brian Ngo
(74) *Attorney, Agent, or Firm* — WPAT, P.C; Anthony King

(57) ABSTRACT

In some embodiments, in a method, a layout of a circuit is received. A netlist with indicated pattern density (PD)-dependent mismatch elements associated with different PDs, respectively, is generated using the layout. A simulation on the netlist is performed such that when the PD-dependent mismatch elements are modeled in the simulation, corresponding model parameters of the PD-dependent mismatch elements are generated using variation distributions with different spreads.

15 Claims, 15 Drawing Sheets

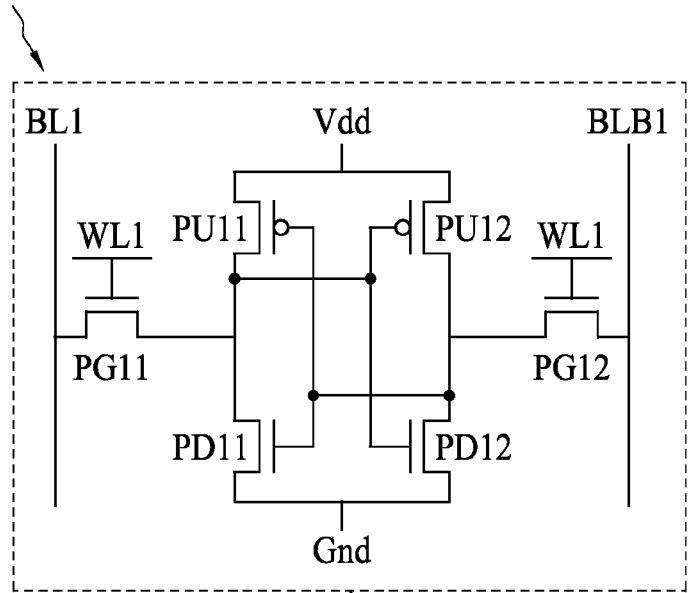
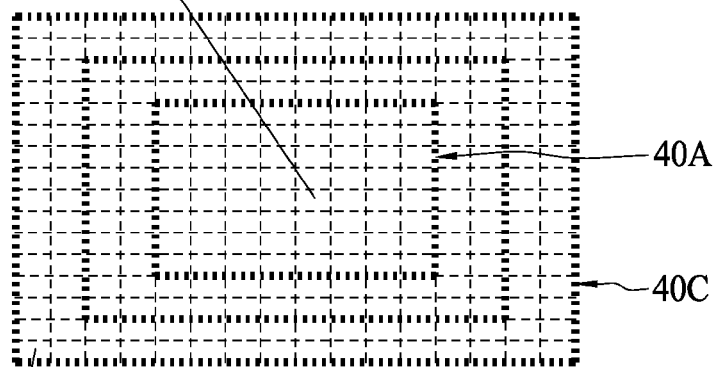
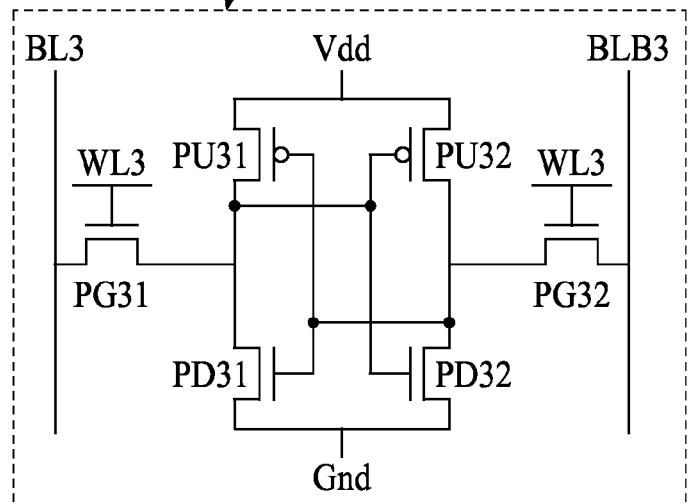
FIG. 4C-2

PATTERN DENSITY-DEPENDENT MISMATCH MODELING FLOW

BACKGROUND

As technology scaling advances, process variations that cause non-uniformity in device performance become more pronounced. Among them, spatial variations resulted from, for example, different distances between patterns of devices, are modeled by a device mismatch model. The device mismatch model is employed in a post-layout simulation performed to ensure functionalities of the design, and evaluate and improve performance of the design.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 4B-1 and 4B-2 are schematic diagrams illustrating manners with which zones are defined in the layout based on the zone setting in accordance with some embodiments.

FIG. 4C-1 is a schematic diagram illustrating a manner with which corresponding zones of the elements in the post-layout netlist are indicated in accordance with some embodiments.

FIG. 4C-2 is a schematic diagram illustrating a manner with which corresponding zones of the elements in the pre-layout netlist are indicated in accordance with some embodiments.

DETAILED DESCRIPTION

Figure 1:
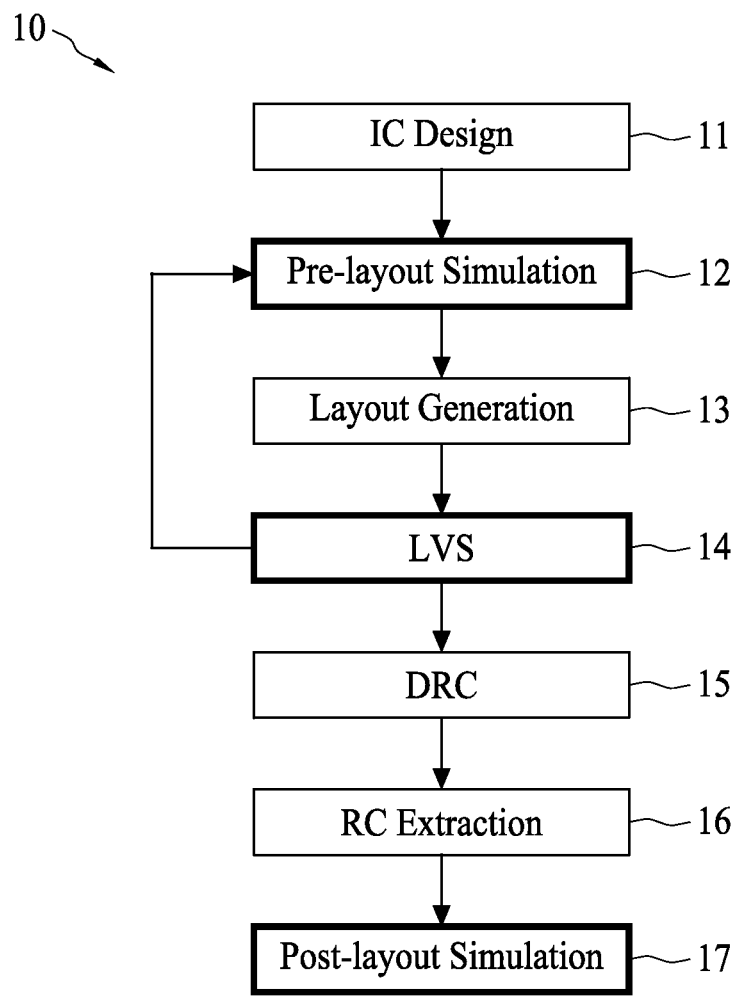
FIG. 1 is a flow diagram of at least a portion of a design flow of an integrated circuit (IC) chip in accordance with some embodiments.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper", "lower", "left", "right" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It will be understood that when an element is referred to as being "connected to" or "coupled to" another element, it may be directly connected to or coupled to the other element, or intervening elements may be present.

FIG. 1 is a flow diagram of at least a portion of a design flow 10 of an integrated circuit (IC) chip in accordance with some embodiments. The design flow 10 utilizes one or more electronic design automation (EDA) tools to carry out one or more stages in the design flow 10.

At an IC design stage 11, a design of the IC chip is provided by a circuit designer. The design of the IC chip includes one or more circuit blocks and connectivities described by a pre-layout netlist. The pre-layout netlist can be represented graphically in a schematic and/or represented textually. In some embodiments, the pre-layout netlist is in a form of a Simulation Program with Integrated Circuit Emphasis (SPICE) netlist.

At a pre-layout simulation stage 12, a pre-layout simulation is performed using the pre-layout netlist to determine if the design meets a predetermined specification. If the design does not meet the predetermined specification, the IC chip is redesigned. In some embodiments, the pre-layout simulation is a SPICE simulation.

At a layout generation stage 13, a layout of the IC chip is generated based on the design. In some embodiments, for standard cell designs, full custom layouts are created for cells, and the layout of the IC chip is generated by an automatic place-and-route tool using the cell layouts. In other embodiments, a full custom layout is created for the entire design. In still other embodiments, the layout of IC chip includes both a full-custom part and an automatically generated part.

At a layout versus schematic (LVS) stage 14, an LVS check is performed to ensure the generated layout correspond to the design. An LVS tool recognizes circuit elements and connections therebetween from patterns in the generated layout, and produces a post-layout netlist representing the recognized circuit elements and connections. The LVS tool then checks whether the post-layout netlist generated from the layout is equivalent to the pre-layout netlist generated from the design. If equivalence is not attained, the design flow 10 returns to the IC design stage 11 and/or the layout generations stage 13 to make correction.

In addition, in some embodiments, the post-layout netlist includes or is modified to include information that can be used by an element mismatch model to account for spatial variations in a post-layout simulation stage 17. In some embodiments, the pre-layout netlist is modified to include the information that can be used by the element mismatch model to account for spatial variations in the pre-layout simulation state 12. The pre-layout simulation stage 12 is revisited so that strategies to combat spatial variations are devised at the earlier design stage.

At a design rule check (DRC) stage 15, a DRC check is performed on the layout to ensure that the layout satisfies certain manufacturing design rules such as the minimum width of a pattern in the layout, a minimum spacing between adjacent patterns in the layout, and a minimum area of a pattern in the layout. If one or more design rules is violated, correction is made to at least one of the layout or the design by returning to the IC design stage 11 or the layout generation stage 13.

At an RC extraction stage 16, parasitic parameters, such as parasitic resistance and parasitic capacitance, of interconnects in the layout are determined and back-annotated in the post-layout netlist for, for example, timing simulations in a subsequent stage.

At a post-layout simulation stage 17, a post-layout simulation is performed on the post-layout netlist to determine, taking the layout information for mismatch modeling and the parasitic parameters into account, whether the layout meets a predetermined specification. If the simulation indicates that the layout does not meet the predetermined specification, optimization is made to at least one of the design or the layout by returning to the IC design stage 11 or the layout generation stage 13. Otherwise, the layout is passed to additional verification process for signoff. In some embodiments, the post-layout simulation is a SPICE simulation.

The design flow 10 in FIG. 1 is exemplary. Other sequence of the stages, or partition of the stages, and/or additional stages before, between or after the stages shown are within the applicable scope of the present disclosure.

Figure 2:
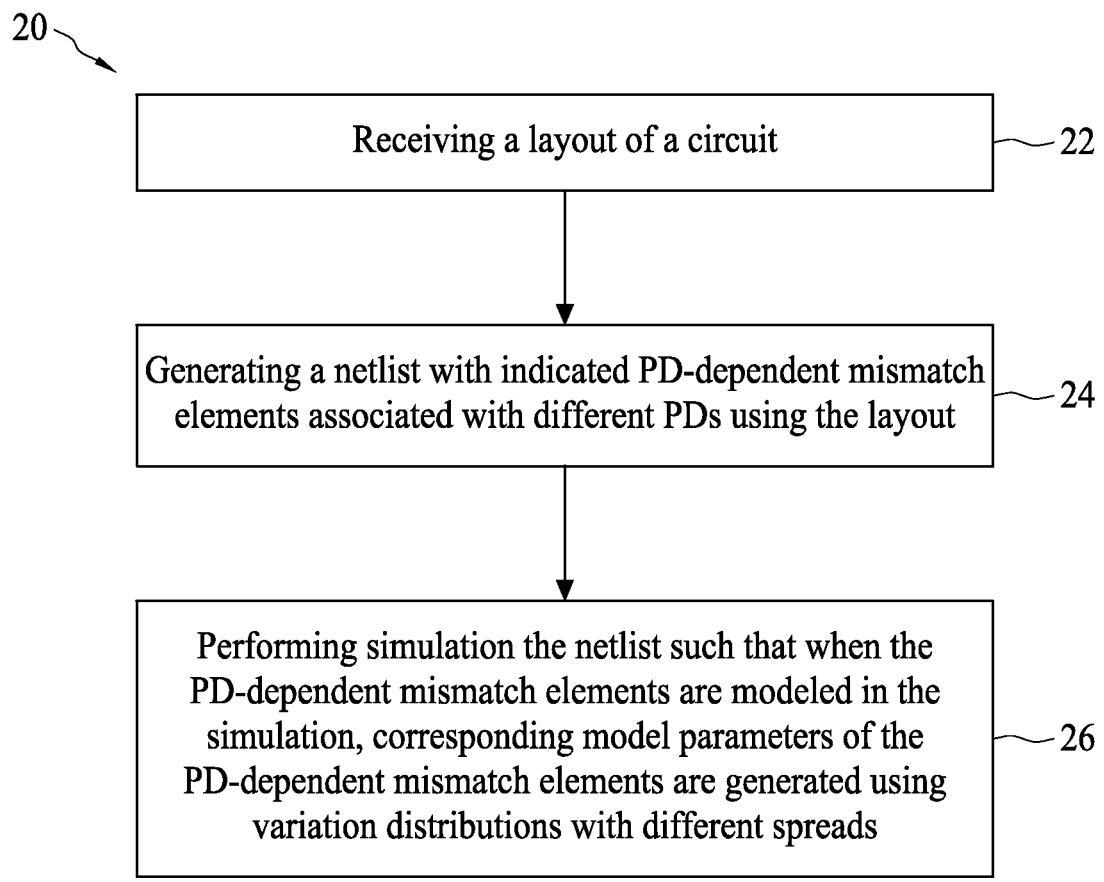
FIG. 2 is a flow diagram of a PD-dependent mismatch modeling flow in accordance with some embodiments.

FIG. 2 is a flow diagram of a PD-dependent mismatch modeling flow 20 in accordance with some embodiments. In operation 22, a layout of a circuit is received. In operation 24, a netlist with indicated PD-dependent mismatch elements associated with different PDs is generated using the layout. The mismatch elements are elements with the same geometry in the layout but have a variability in an electrical property due to process variations that occur when the circuit is fabricated. The PD-dependent mismatch elements are mismatch elements having different variabilities in the electrical property, respectively, when the mismatch elements are located in layout zones with different PDs, respectively. The PD, pattern density, is defined as a ratio of polygons drawn in a region in a layer of a layout to an area of the region in the layer of the layout. It is intended that the term "PD" used throughout the present disclosure to encompass any measure representative of the PD of the region in the layer of the layout, such as a measure based on spacings in the region. In operation 26, a simulation is performed on the netlist such that when the PD-dependent mismatch elements are modeled in the simulation, corresponding model parameters of the PD-dependent mismatch elements are generated using variation distributions with different spreads. In some embodiments, the operations 22 and 24 are performed at the LVS stage 14 in FIG. 1, and the operation 26 is performed at the post-layout simulation stage 17 or as the design flow 10 returns to the pre-layout simulation stage 12 in FIG. 1.

Figure 3A:
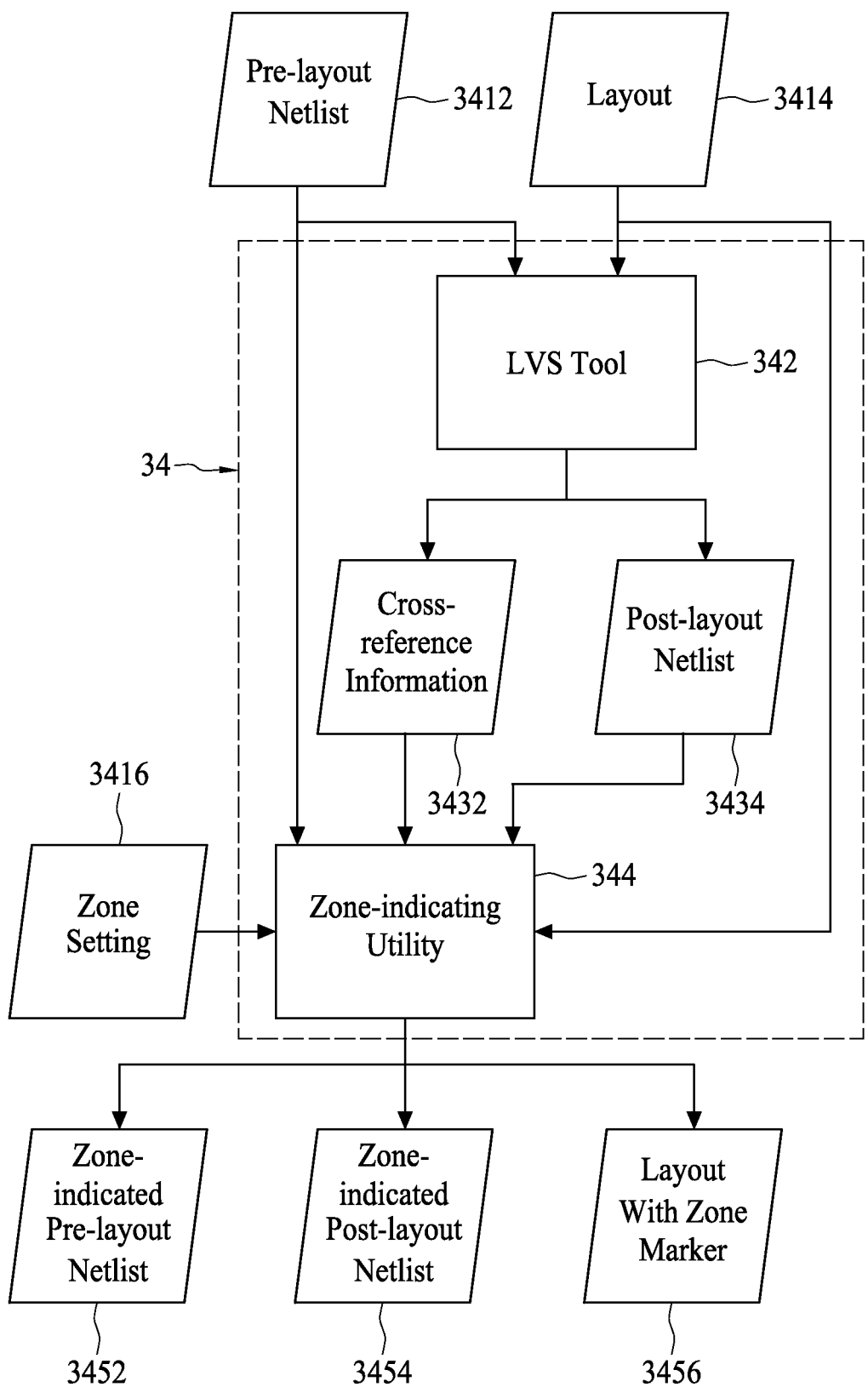
FIG. 3A is a functional block diagram of a netlist-generating tool for generating a netlist with indicated PD-dependent mismatch elements in accordance with some embodiments.

FIG. 3A is a functional block diagram of a netlist-generating tool 34 for generating a netlist with indicated PD-dependent mismatch elements in accordance with some embodiments. In some embodiments, the operations 22 and 24 in FIG. 2 are performed by the netlist-generating tool 34 that includes an LVS tool 342 and a zone-indicating utility 344. The LVS tool 342 receives a pre-layout netlist 3412 and a layout 3414. The LVS tool 342 is configured to extract circuit elements and connections from the layout to generate a post-layout netlist 3434, and to compare the post-layout netlist 3434 with the pre-layout netlist 3412 to generate cross-reference information between the pre-layout netlist 3412 and the post-layout netlist 3434. The extracted circuit elements include PD-dependent mismatch elements. The zone-indicating utility 344 receives the post-layout netlist 3434 which includes location information of the PD-dependent mismatch elements and the zone setting 3416 in which boundaries of zones with different PDs are specified. The zone-indicating utility 344 is configured to back-annotate the post-layout netlist 3434 with the corresponding zones of the PD-dependent mismatch elements based on the zone setting 3416 to generate a zone-indicated post-layout netlist 3454. In addition, in some embodiments, the zone-indicating utility 344 further receives the pre-layout netlist 3412 and the cross-reference information 3432 and is further configured to back-annotate the pre-layout netlist 3412 with the corresponding zones of the PD-dependent mismatch elements based on the zone setting 3416 to generate a zone-indicated pre-layout netlist 3452. Moreover, in some embodiments, the zone-indicating utility 344 receives the layout 3414 and is further configured generate a layout with zone markers 3456 that delineate the zones on the layout based on the zone setting 3416, as exemplarily shown by the layout 40 with delineated zones 40A, 40B and 40C in FIG. 4B-1.

Figures 3B, 3C:
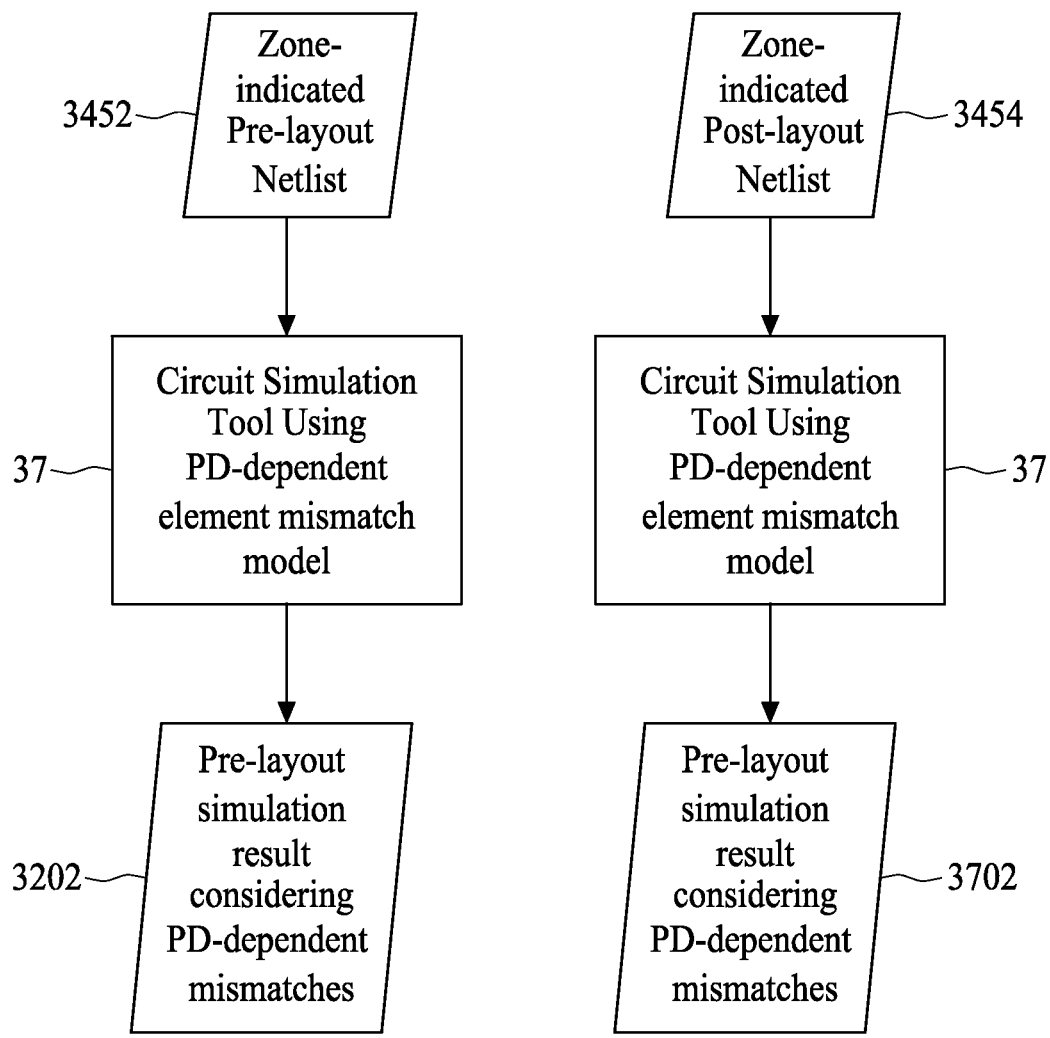
FIGS. 3B and 3C are functional block diagrams of a circuit simulation tool using a PD-dependent element mismatch model in accordance with some embodiments.

FIGS. 3B and 3C are functional block diagrams of a circuit simulation tool 37 using a PD-dependent element mismatch model in accordance with some embodiments. In some embodiments, the operation 26 in FIG. 2 is performed by the circuit simulation tool 37 using the PD-dependent element mismatch model. Referring to FIG. 3B, in some embodiments, the circuit simulation tool 37 receives the zone-indicated pre-layout netlist 3452 and is configured to perform a pre-layout simulation on the pre-layout netlist 3452. In some embodiments, the pre-layout simulation includes timing analysis, and/or power analysis. When the PD-dependent mismatch elements are modeled using the PD-dependent element mismatch model in the simulation, different variabilities, variation distributions with different spreads, are applied to respective model parameters of the PD-dependent mismatch elements. As a result, a pre-layout simulation result considering PD-dependent mismatches is generated. Referring to FIG. 3C, in some embodiments, the circuit simulation tool 37 receives the zone-indicated post-layout net list 3454 and is configured to perform simulation configured to perform a post-layout simulation on the post-layout netlist 3454. In some embodiments, the post-layout simulation includes timing analysis, power analysis, and/or signal integrity analysis. Similar to the embodiments, described with reference to FIG. 3B, when the PD-dependent mismatch elements are modeled using the PD-dependent element mismatch model in the simulation, different variabilities are applied to respective model parameters of the PD-dependent mismatch elements. Therefore, a post-layout simulation result considering PD-dependent mismatches is produced.

Figure 4A:
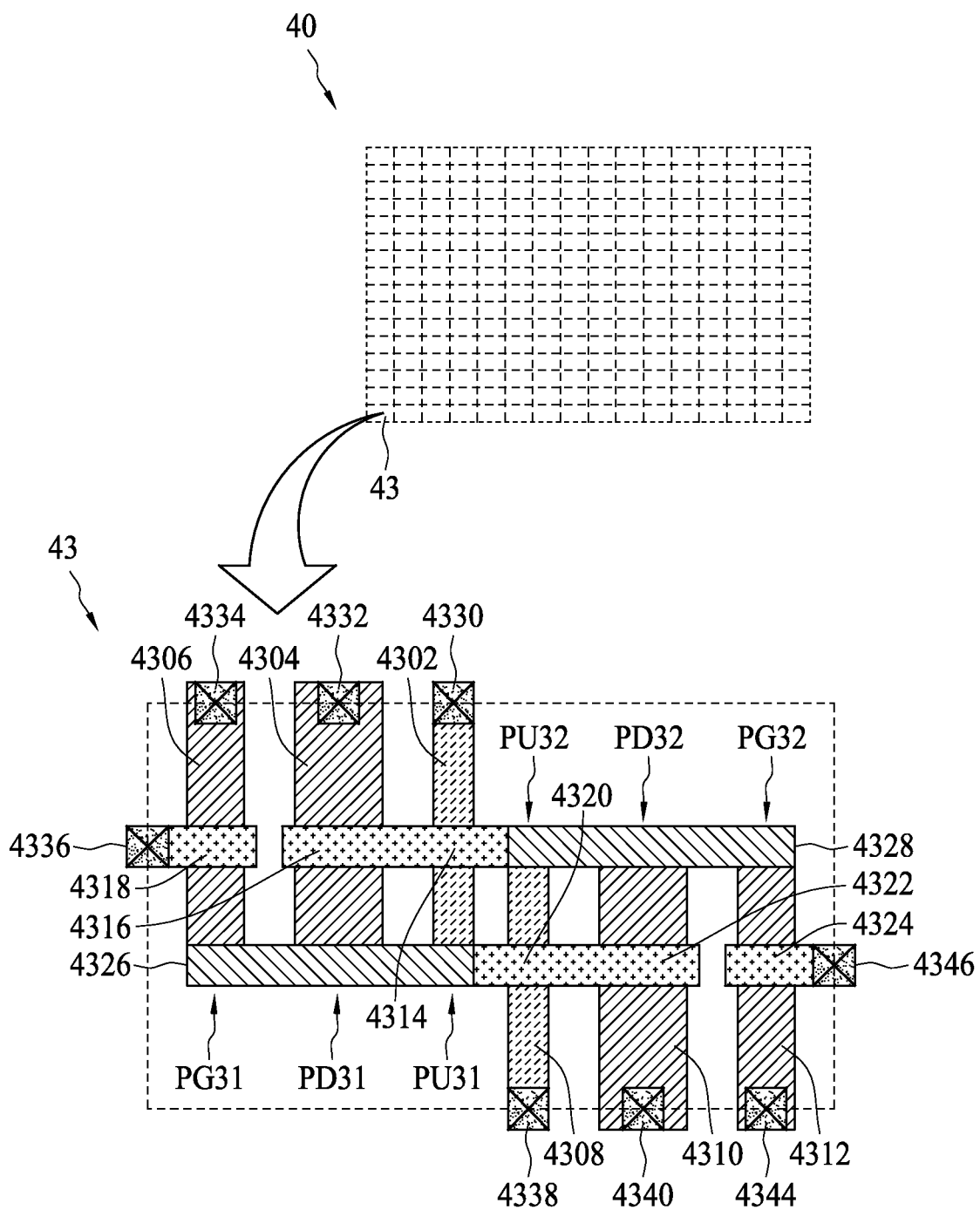
FIG. 4A is a schematic top view diagram of an SRAM array layout and a zoomed-in bit cell layout of the SRAM array layout in accordance with some embodiments.

As shown in FIG. 3A, the LVS tool 342 receives the layout 3414. In some embodiments, the layout 3414 is a static random access memory (SRAM) array layout. FIG. 4A is a schematic top view diagram of an SRAM array layout 40 and a zoomed-in bit cell layout 43 of the SRAM array layout 40 in accordance with some embodiments. As an example, the SRAM array has 16×16 bit cells. The bit cell layout 43 exemplarily shows a layout of one of the bit cells. Other bit cells are similarly or symmetrically drawn. In some embodiments, the bit cell layout 43 includes polygons 4302 and 4308 in a p+ diffusion layer, polygons 4304, 4306, 4310 and 4312 in an n+ diffusion layer, connected polygons 4314 and 4316, 4320 and 4322, and polygons 4318 and 4324 in a polysilicon layer, polygons 4326 and 4328 in a layer below metal 0, and polygons 4330, 4332, 4334, 4336, 4338, 4340, 4344 and 4346 in a via layer. For simplicity, metal layers are not shown.

As shown in FIG. 3A, the LVS tool 342 generates the post-layout netlist 3434 from the layout 342. Referring to FIG. 4A, in some embodiments, the LVS tool 342 extracts circuit elements and connections from the SRAM array layout 40 to form the post-layout netlist 3434. For example, LVS tool 342 recognizes the patterns in the bit cell layout 43 include 6 transistors and connections thereof. For example, the polygons 4314 and 4302, or 4320 and 4308 represent a gate, and a source and a drain of a pull up transistor PU31 or PU32, respectively. The polygons 4316 and 4304, or 4322 and 4310 represent a gate, and a source and a drain of a pull down transistor PD31 or PD32, respectively. The polygons 4318 and 4306, or 4324 and 4312 represent a gate, and a source and a drain of a pass transistor PG31 or PG32, respectively. Further, the drains of the transistors PU31 and PD31, or PU32 and PD32, and one of the source and drain of the transistor PG31 or PG32 are coupled by an intra-cell connection represented by the polygon 4326 or 4328. The intra-cell connection for the transistors PU31, PD31 and PG31, or PU32, PD32 and PG32 are coupled to the gates of the transistors PU32 and PD32, or PU31 and PD31. The sources of the transistors PU31 and PD31, or PU32 and PD32 are coupled externally to the power Vdd and ground Gnd (not shown) through contacts represented by the polygons 4330 and 4332, or 4338 and 4340. The gate and the other of the source and drain of the transistor PG31 or PG32 are coupled externally to a word line, and a bit line or a bit line bar (not shown) through contacts represented by the polygons 4336 and 4334, or 4346 and 4344, respectively. The transistors PU31, PD31, PG31, PU32, PD32, and PG32 can be but not limited to be implemented as metal-oxide semiconductor field effect transistors (MOSFETs), FinFETs, gate-all-around FETs. In addition, in some embodiments, the post-layout netlist 3434 further includes location information and geometry information of the extracted circuit elements.

Figures 1, 4B:
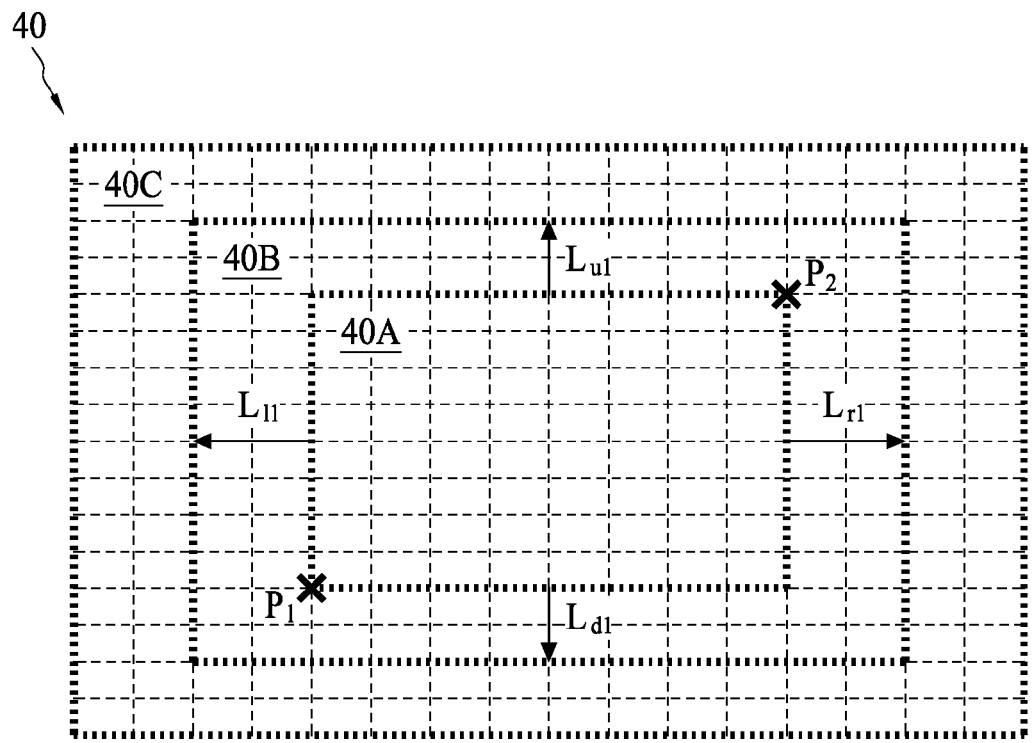
Figures 2, 4B:
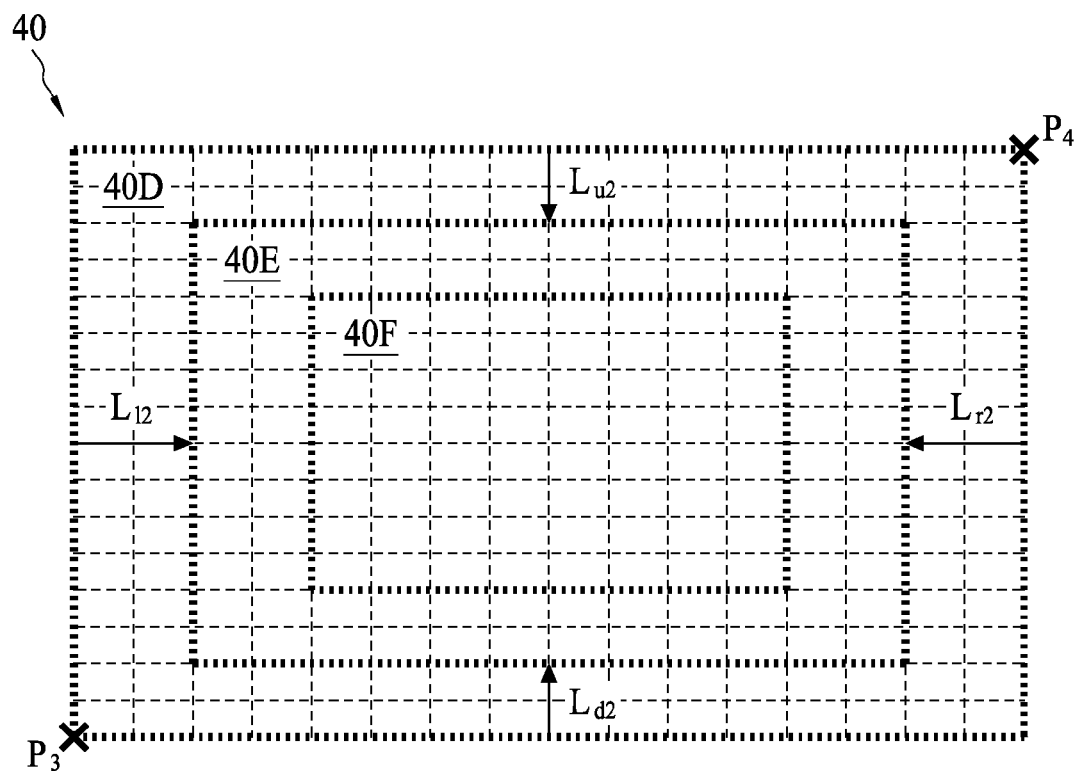

As shown in FIG. 3A, the zone-indicating utility 344 receives the post-layout netlist 3434 and the zone setting 3416. FIGS. 4B-1 and 4B-2 are schematic diagrams illustrating manners with which zones are defined in the layout 40 based on the zone setting 3416 in accordance with some embodiments. Typically, patterns closer to a center of a memory array layout has a higher PD than patterns closer to a periphery of the memory array layout. Some examples of fabrication operations affected by PDs include dry etching, and planarization by chemical mechanical polishing (CMP). Etch rates of, for example, polysilicon and fin structures are affected by the differences in PDs, a phenomenon known as a loading effect. In a replacement gate process, the gate stack layers replacing a sacrificial polysilicon gate is planarized by CMP. Removal rates of the gate stack layers are also affected by the differences in PDs. Therefore, although a first transistor closer to the center of the memory array has the same layout as a second transistor closer to the periphery of the memory array, the first transistor and the second transistor exhibit a variability in, for example, device geometries, which result in a variability in, for example, in threshold voltages of the first transistor and the second transistor.

In the embodiments shown in FIG. 4B-1, three zones, an inner zone 40A, an intermediate zone 40B and an outer zone 40C, are defined in the layout 40 from a center to a periphery of the layout 40. In the zone setting 3416, a location $P_1$ of a lower left corner and a location $P_2$ of an upper right corner of the inner zone 40A is specified. The intermediate zone 40B is defined by moving an upper boundary of the inner zone 40A upward by a distance $L_{u1}$, a lower boundary of the inner zone 40A downward by a distance $L_{d1}$, a left boundary of the inner zone 40A leftward by a distance $L_{l1}$, and a right boundary of the inner zone 40A rightward by a distance $L_{v1}$. By the same token, the outer zone 40C is defined by moving outward the boundaries of the intermediate zone 40B by the corresponding distances.

In the embodiments shown in FIG. 4B-2, three zones, an outer zone 40D, an intermediate zone 40E, and an inner zone 40F, are defined in the layout 40 from a periphery to a center of the layout 40B. In the zone setting 3416, a location $P_3$ of a lower left corner and a location $P_4$ of an upper right corner of the outer zone 40D is specified. The intermediate zone 40E is defined by moving an upper boundary of the outer zone 40D downward by a distance $L_{u2}$, a lower boundary of the outer zone 40D upward by a distance $L_{d2}$, a left boundary of the outer zone 40D rightward by a distance $L_{l2}$, and a right boundary of the outer zone 40D leftward by a distance $L_{r2}$. By the same token, the inner zone 40F is defined by moving inward the boundaries of the intermediate zone 40B by the corresponding distances.

The manners with which zones are defined in the layout 40 shown in FIGS. 4B-1, 4B-2 are exemplary. Other ways, such as defining each zone by the respective boundary points in an irregular layout, are within the contemplated scope of the present disclosure. Also, the number of zones defined in the layout 40 is exemplary. Other number of zones are within the contemplated scope of the present disclosure.

Figures 1, 4C:
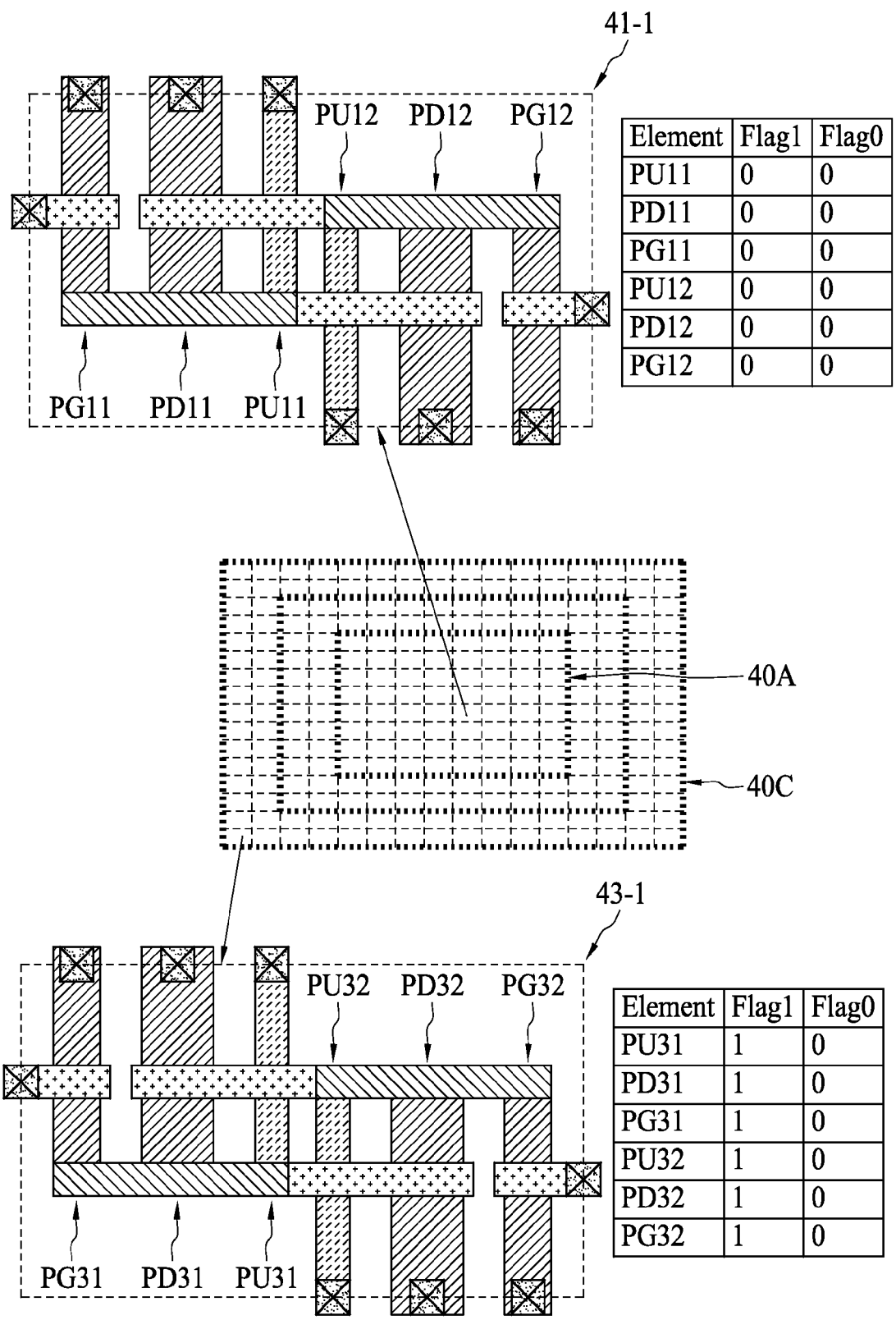

As shown in FIG. 3A, the zone-indicating utility 344 back-annotates the circuit elements in the post-layout netlist 3434 with the corresponding zones where the circuit elements reside based on the zone setting 3416 to generate the zone-indicated post-layout netlist 3454. FIG. 4C-1 is a schematic diagram illustrating a manner with which corresponding zones of the elements in the post-layout netlist 3454 are indicated in accordance with some embodiments. In some embodiments, the corresponding zones of the circuit elements are indicated by a zone flag. For example, the post-layout netlist 3434 contains extracted transistors PU11, PD11, PG11, PU12, PD12 and PG12 from a bit cell layout 41-1 located in the inner zone 40A. Based on the location information of the extracted circuit elements in the post-layout netlist 3434, and the zones 40A, 40B and 40C defined using the zone setting 3416, the zone-indicating utility 344 back annotates the extracted transistors PU11, PD11, PG11, PU12, PD12 and PG12 in the post-layout netlist 3434 with a 2-bit zone flag that has the value of "00". The post-layout netlist 3434 contains extracted transistors PU31, PD31, PG31, PU32, PD32 and PG32 from a bit cell layout 43-1 located in the outer zone 40C. The zone-indicating utility 344 back annotates the extracted transistors PU31, PD31, PG31, PU32, PD32 and PG32 in the post-layout netlist 3434 with the 2-bit zone flag that has the value of "10". In some other embodiments, the location information can be directly obtained from the layout 3414.

In addition, as shown in FIG. 3A, the LVS tool 342 receives the pre-layout netlist 3412 and the layout 3414, and compares the post-layout netlist 3434 generated from the layout 3414 with the pre-layout netlist 3412 to produce the cross-reference information 3434 between the pre-layout netlist 3412 and the post-layout netlist 3434. The zone-indicating utility 344 receives the pre-layout netlist 3412, the post-layout netlist 3434, the cross-reference information 3432 and the zone setting 3416 and back-annotates circuit elements in the pre-layout netlist 3412 with corresponding zones in which the corresponding circuit elements in the post-layout netlist 3434 reside to generate the zone-indicated pre-layout netlist 3452. FIG. 4C-2 is a schematic diagram illustrating a manner with which corresponding zones of the elements in the pre-layout netlist 3452 are indicated in accordance with some embodiments. The pre-layout netlist 3412 describes the SRAM array without some physical information such as the locations of the circuit elements in layout 3414. In some embodiments, the pre-layout netlist 3412 can be represented by a schematic circuit diagram which contains circuit element symbols connected by lines. As an example, a schematic circuit diagram of a bit cell 43-2 is shown in FIG. 4C-2. The bit cell 43-2 includes 6 transistors—a pull up transistor PU31, a pull down transistor PD31, a pass transistor PG31, a pull up transistor PU32, a pull down transistor PD32 and a pass transistor PG32. Drains of the transistors PU31 and PD31, or PU32 and PD32 and one of the source or drain of the transistor PG31 or PG32 are coupled to gates of the transistors PU32 and PD32, PU31 and PD31. Sources of the transistors PU31 and PD31, or PU32 and PD32 are coupled to the power Vdd and the ground Gnd, respectively. A gate and the other of the source or drain of the transistor PG31 or PG32 are coupled to a word line WL1 and a bit line BL3 or a bit line bar BLB3, respectively. As described with reference to FIG. 4A, the post-layout netlist 3434 contains extracted circuit components and connections from the SRAM array layout 40. For example, the extracted circuit components of the bit cell layout 43 includes the transistors PU31, PD31, PG31, PU32, PD32 and PG32. In some embodiments, the LVS tool 342 compares the pre-layout netlist 3412 and the post-layout netlist 3434 and determines that the transistors PU31, PD31, PG31, PU32, PD32, and PG32 in the bit cell 43-2 correspond to the extracted transistors PU31, PD31, PG31, PU32, PD32, and PG32 from the bit cell layout 43, respectively, and records such correspondence in the cross reference information 3432. Similarly, the bit cell 41-2 in the pre-layout netlist 3434 includes the transistors PU11, PD11, PG11, PU12, PD12 and PG12, the connections thereof which includes connections to the power Vdd, the ground Gnd, a word line WL1, a bit line BL1 and a bit line bar BLB1. The LVS tool 342 determines that the bit cell 41-2 in FIG. 4C-2 corresponds to the extracted bit cell 41-1 in FIG. 4C-1, and record such correspondence in the cross reference information 3432.

As described with reference to FIG. 4B, based on the zone setting 3416, the zone-indicating utility 344 defines zones with different PDs in the SRAM array layout 40. Then, based on the location information of the circuit elements in the post-layout netlist 3434 and the cross reference information 3432, the zone-indicating utility 344 determines that the transistors PU11, PD11, PG11, PU12, PD12 and PG12 in the bit cell 41-2 are located in the inner zone 40A, and therefore back-annotates the transistors PU11, PD11, PG11, PU12, PD12 and PG12 in the pre-layout netlist 3412 with a 2-bit zone flag that has the value of "00". The zone-indicating utility 344 determines that the transistors PU31, PD31, PG31, PU32, PD32 and PG32 in the bit cell 43-2 are located in the outer zone 40C, and hence back-annotates the transistors PU31, PD31, PG31, PU32, PD32 and PG32 in the pre-layout netlist 3412 with the 2-bit zone flag that has the value of "10".

Figure 4D:
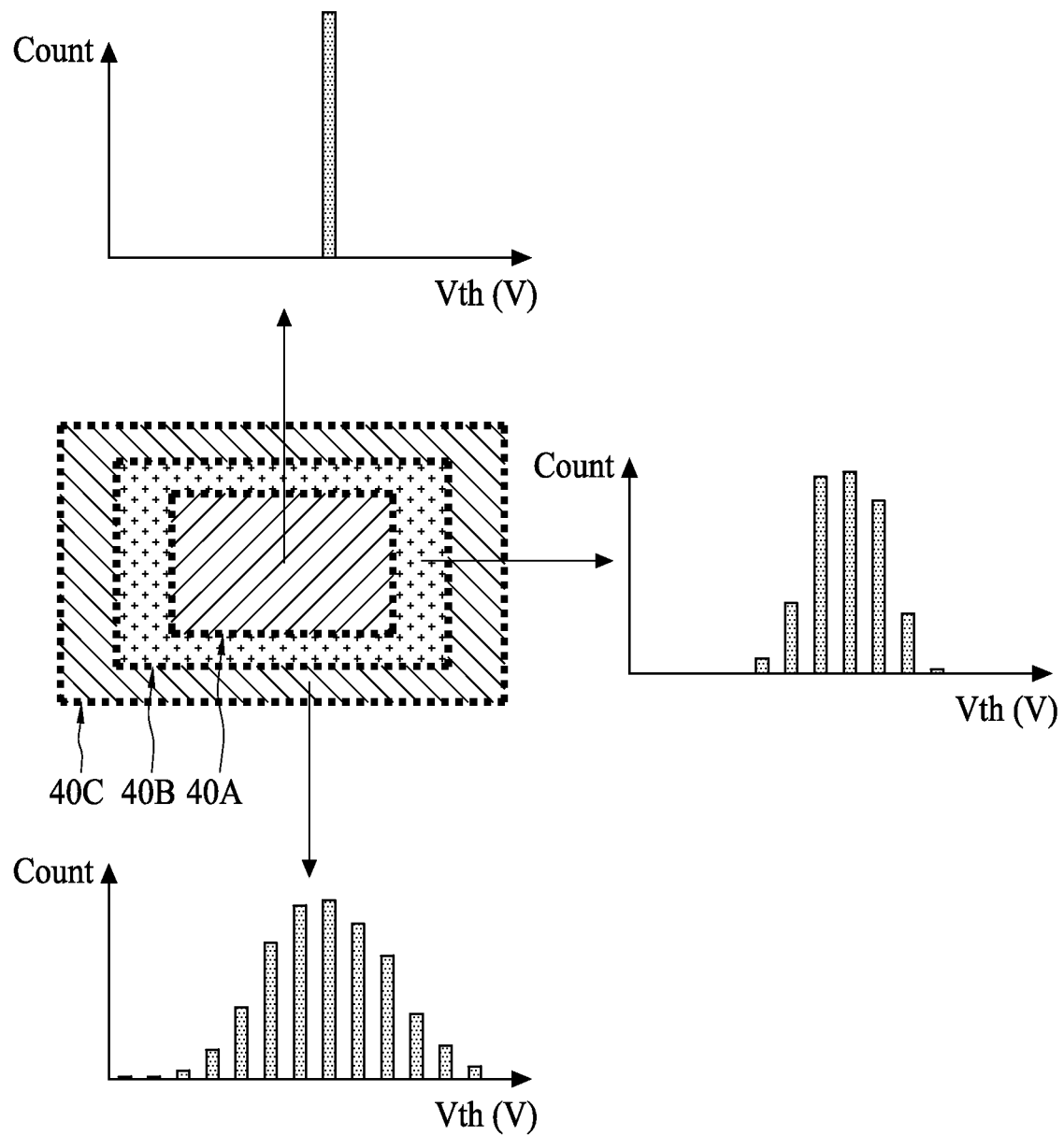
FIG. 4D is a schematic diagram illustrating different variabilities applied to a model parameter of a PD-dependent element mismatch model to model the PD-dependent mismatch elements in the SRAM array layout in accordance with some embodiments.

As shown in FIGS. 3B and 3C, the circuit simulation tool 37 receives the zone-indicated pre-layout netlist 3452 or the zone-indicated post-layout netlist 3454, and performs a pre-layout simulation or a post-layout simulation on the netlist 3452 or 3454 to generate the pre-layout simulation result considering PD-dependent mismatches 3202 or the post-layout simulation result considering PD-dependent mismatches 3702. With the indicated zones in the description of the circuit elements in the netlist 3452 or 3454, the circuit simulation tool 37 recognizes that, for example, the transistors PU11 and PU31 shown in FIG. 4C-1 or 4C-2 are PD-dependent mismatch elements, and models the PD-dependent mismatch elements differently by applying different variabilities to at least one model parameter of a PD-dependent element mismatch model. FIG. 4D is a schematic diagram illustrating different variabilities applied to a model parameter of a PD-dependent element mismatch model to model the PD-dependent mismatch elements in the SRAM array layout 40 in accordance with some embodiments. As described with reference to FIG. 4B-1, the PDs of the SRAM array layout 40 are in a descending order from the inner zone 40A, intermediate zone 40B, to the outer zone 40C. Referring to FIG. 4D, in some embodiments, a variability in the model parameters of the PD-dependent mismatch elements in a zone with a higher PD is lower than a variability in the model parameters of the PD-dependent mismatch elements in a zone with a lower PD. For example, a distribution of threshold voltages Vth at a top part of FIG. 4D is collected from, for example, corresponding pull up transistors in the bit cells in the inner zone 40A. A distribution of threshold voltages at a right part of FIG. 4D is collected from, for example, corresponding pull up transistors in the bit cells in the intermediate zone 40B. A distribution of threshold voltages at a bottom part of FIG. 4D is collected from, for example, the corresponding pull up transistors in the bit cells in the outer zone 40C. The distribution for the inner zone 40A has the smallest spread among the three and therefore the smallest variability. The distribution for the outer zone 40C has the largest spread among the three and therefore the largest variability. The distribution for the intermediate zone 40B has a spread between those of the inner zone 40A and the outer zone 40C.

In some embodiments, when the circuit simulation tool 37 models the PD-dependent mismatch elements, which, in this case, are the corresponding pull up transistors in the bit cells the inner zone 40A, the intermediate zone 40B and the outer zone 40C, the circuit simulation tool 37 generates the model parameters of the transistors in the inner zone 40A, the intermediate zone 40B, and the outer zone 40C, using the respective distributions. For example, the model parameter associated with the threshold voltage of a PD-dependent mismatch element in the inner zone 40A is generated using the distribution of the inner zone 40A, and the model parameter associated with the threshold voltage of a PD-dependent mismatch element in the outer zone 40C is generated using the distribution of the outer zone 40C.

Using the back-annotated zone flag to apply different variability for the PD-dependent mismatch elements is exemplary. Other ways, such as directly setting the model parameters of the PD-dependent mismatch elements in the pre-layout netlist 3412 or the post-layout netlist 3414 based on the zone setting 3416, are within the contemplated scope of the present disclosure.

Figure 4E:
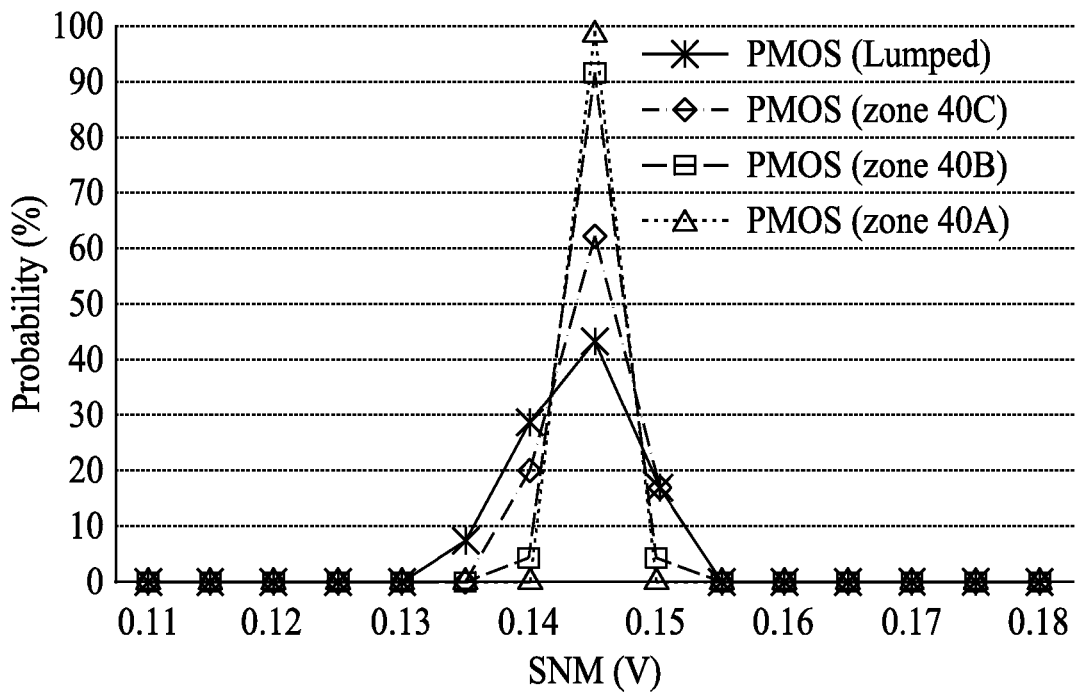
FIG. 4E shows probability distributions of the SNM of the bit cells in the SRAM array when the differences in PDs is not considered when modeling PMOS transistors in the simulation, and when the differences in PDs in different zones are considered when modeling PMOS transistors in the simulation in accordance with some embodiments.
Figure 4F:
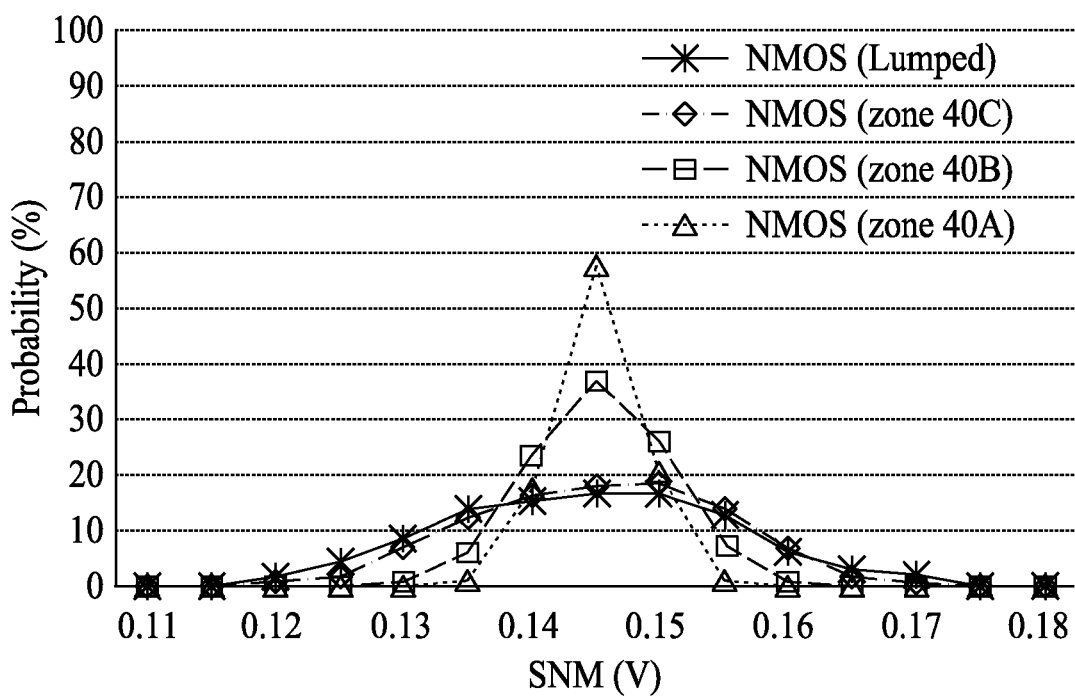
FIG. 4F shows probability distributions of the SNM of the bit cells in the SRAM array when the differences in PD is not considered when modeling NMOS transistors in the simulation, and when the differences in PD in different zones are considered when modeling NMOS transistors in the simulation in accordance with some embodiments.

With the effect of different PDs on the variability of the model parameter taken into consideration, the pre-layout simulation result 3202 or the post-layout simulation result 3702 are more accurate. Further optimization or subsequent design can therefore be based on more accurate simulation results. FIG. 4E shows probability distributions of the static noise margin (SNM) of the bit cells in the SRAM array when the differences in PDs is not considered when modeling PMOS transistors in the simulation, and when the differences in PDs in different zones are considered when modeling PMOS transistors in the simulation in accordance with some embodiments. FIG. 4F shows probability distributions of the SNM of the bit cells in the SRAM array when the differences in PD is not considered when modeling NMOS transistors in the simulation, and when the differences in PD in different zones are considered when modeling NMOS transistors in the simulation in accordance with some embodiments. In FIG. 4E or FIG. 4F, a legend labeled as "Lumped" corresponds to a lumped case when one variability is applied when modeling all PMOS or NMOS transistors. In other words, the effect of differences in PDs is not considered. Legends labeled as "zone 40C", "zone 40B" and "zone 40A" correspond to a PD-dependent case when different variabilities are applied when modeling PMOS or NMOS transistors in the zone 40C, zone 40B and zone 40A, respectively. As shown in FIG. 4E or FIG. 4F, the probability distribution of the lumped case has one spread which is the widest among all distributions. The probability distributions of the PD-dependent case has different spreads for different zones. The spreads of the distributions get narrower when the order of the zones is the outer zone 40C, the intermediate zone 40B and the inner zone 40A. Further, because each bit cell has 4 NMOS transistors and 2 PMOS transistors, the variation in SNM is dominated by the variations in the NMOS transistors, as illustrated by the wider spreads of each distribution in FIG. 4F compared to the corresponding distribution in FIG. 4E.

Figure 5A:
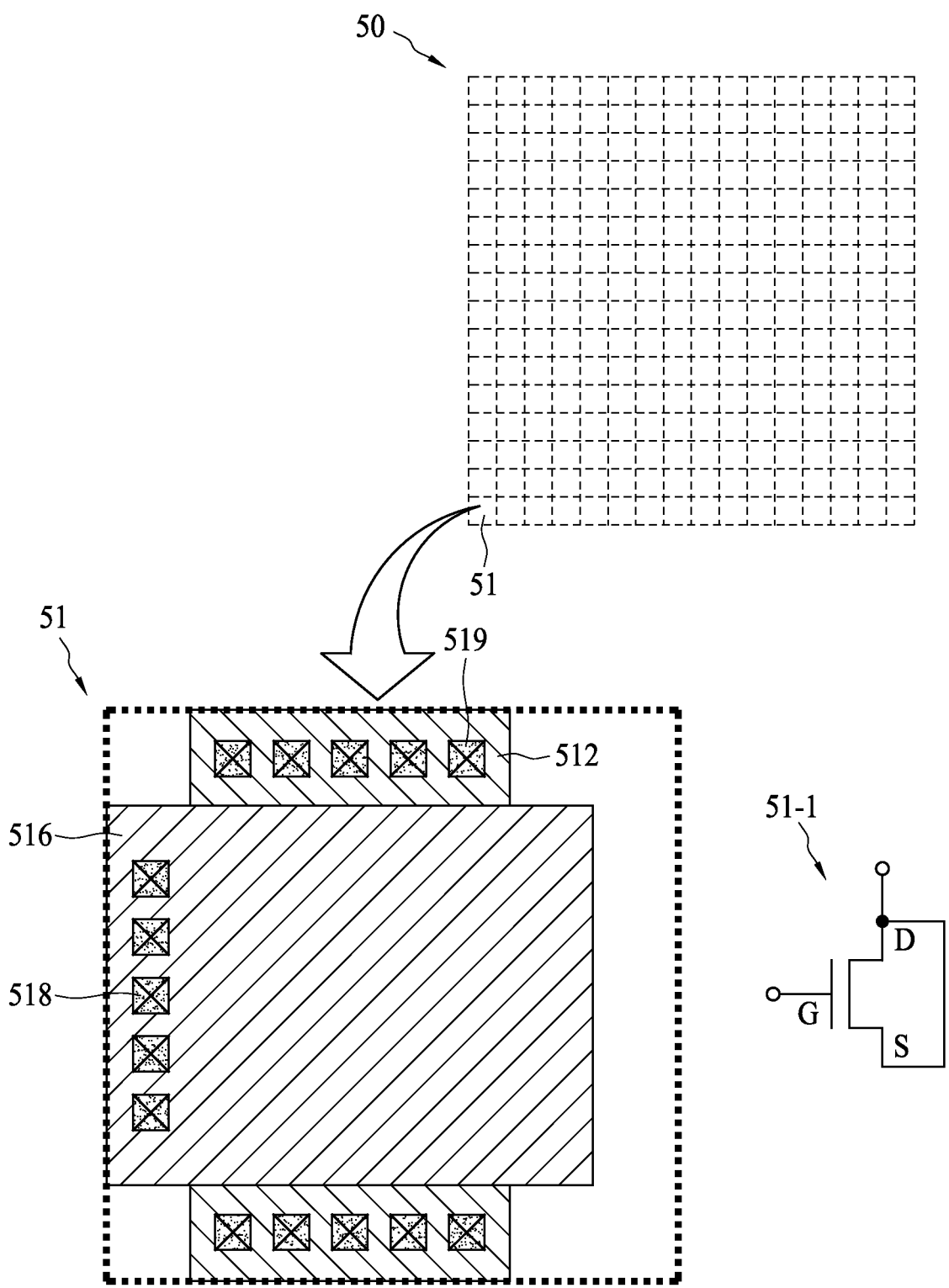
FIG. 5A is a schematic top view diagram of a MOS capacitor array, a zoomed-in cell layout of the MOS capacitor array 50, and a cell circuit symbol in accordance with some embodiments.

The embodiments described with references to FIGS. 4A to 4F use the SRAM array as the example. The present disclosure is also applicable to other types of arrays such as a MOS capacitor array. FIG. 5A is a schematic top view diagram of a MOS capacitor array 50, a zoomed-in cell layout 51 of the MOS capacitor array 50, and a cell circuit symbol 51-1 in accordance with some embodiments. The cell layout 51 includes a polygon 512 in an n+ diffusion layer, a polygon 516 in a polysilicon layer, and polygons 518 and 519 in a via layer. For simplicity, metal layers are not shown. Similar to the embodiments described with reference to FIG. 4A, the LVS tool 342 in FIG. 3A recognizes the polygon 516 a gate of a MOS transistor, the polygon 516 as source and drain of the MOS transistor, and the source and drain of the MOS transistor are coupled together through a metal layer (not shown) connected to the contacts represented by the polygons 512 on the source and drain. Therefore, the cell layout 51 is extracted as a MOS capacitor, which is the MOS transistor with coupled source and drain, in the post-layout netlist 3434. In the pre-layout netlist 3412, a MOS capacitor of a cell 51-1 is represented by a MOS transistor of which a gate and a drain serve as the electrodes of the MOS capacitor, and a source is coupled to the drain. By comparing the post-layout netlist 3434 with the pre-layout netlist 3412, the LVS tool 342 determines that the extracted MOS capacitor from the cell layout 51 in the post-layout netlist 3434 corresponds to the MOS capacitor in the cell 51-1 in the pre-layout netlist 3412.

Figure 5B:
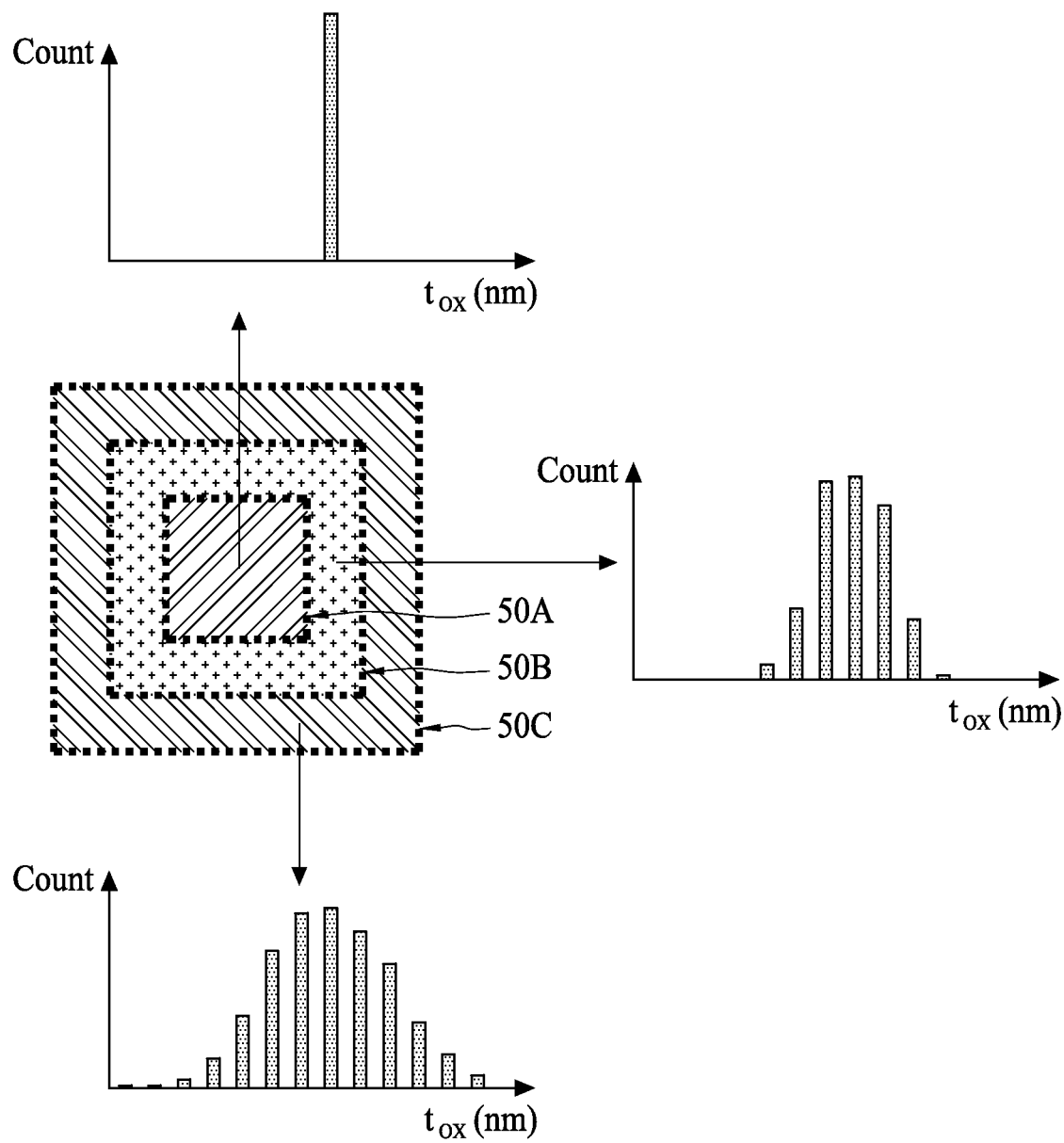
FIG. 5B is a schematic diagram illustrating different variabilities applied to a model parameter of a PD-dependent element mismatch model to model the PD-dependent mismatch elements in the MOS capacitor array layout in accordance with some embodiments.

FIG. 5B is a schematic diagram illustrating different variabilities applied to a model parameter of a PD-dependent element mismatch model to model the PD-dependent mismatch elements in the MOS capacitor array layout 50 in accordance with some embodiments. Similar to the embodiments described with references to FIGS. 4B to 4C, the zone-indicating utility 344 in FIG. 3A defines an inner zone 50A, an intermediate zone 50B and an outer zone 50C in the layout 50, and back-annotates the circuit elements in the pre-layout netlist 3412 or the post-layout netlist 3414 with the corresponding zones. Compared to the embodiments described with reference to FIG. 4D, the circuit simulation tool 37 shown in FIG. 3B or FIG. 3C recognizes the MOS capacitors in the layout 50 are PD-dependent mismatch elements, and apply different variabilities to a model parameter, such as a gate oxide thickness $t_{ox}$ associated with capacitance of a MOS capacitor, to model the PD-dependent mismatch elements. As shown in FIG. 5B, the gate oxide thicknesses $t_{ox}$ of the MOS capacitors in the inner zone 50A are generated using a distribution with the smallest spread among the three zones, the gate oxide thicknesses $t_{ox}$ of the MOS capacitors in the outer zone 50C are generated using a distribution with the largest spread among the three zones, and the gate oxide thicknesses $t_{ox}$ of the MOS capacitors in the intermediate zone 50B are generated using a distribution with the spread between those of the other two zones.

Figure 6:
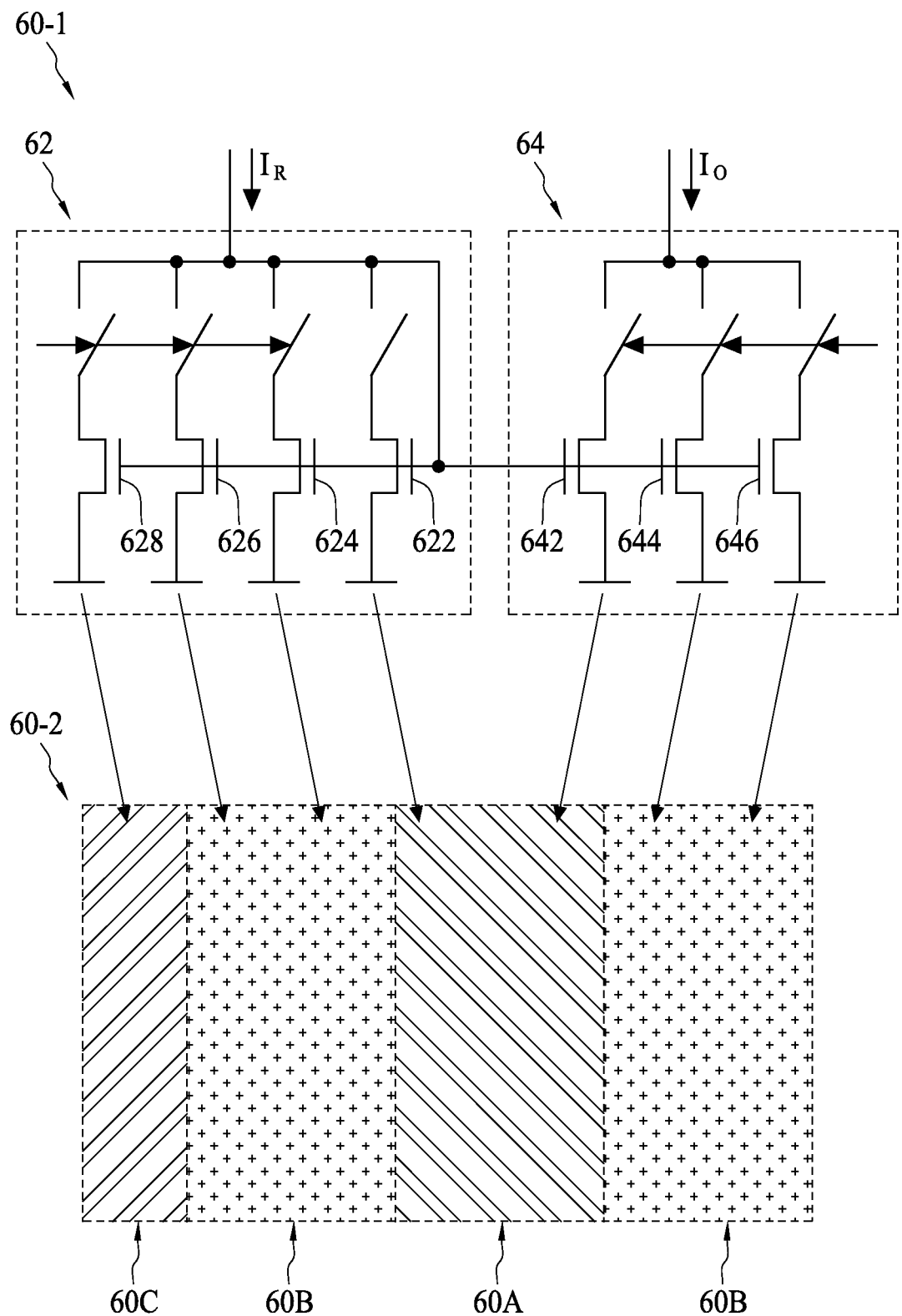
FIG. 6 is a schematic diagram illustrating a circuit diagram of a programmable current mirror system and a layout of the programmable current mirror system in accordance with some embodiments.

The embodiments described with references to FIGS. 4A to 5B use array circuits as examples. The present disclosure is also applicable to other types of circuits that use a current mirror or a differential pair that is sensitive to mismatch in circuit elements. FIG. 6 is a schematic diagram illustrating a circuit diagram 60-1 of a programmable current mirror system and a layout 60-2 of the programmable current mirror system in accordance with some embodiments. As shown in the circuit diagram 60-1, the programmable current mirror system includes a reference system 62 and a mirror system 64. The reference system 62 is configured to receive a reference current $I_R$ and the mirror system 64 is configured to generate an output current $I_o$ based on the reference current $I_R$. The reference system 62 includes multiple transistors 622, 624, 626 and 628 coupled in parallel, and the mirror system 64 includes multiple transistors 642, 644 and 646 coupled in parallel. Each of the transistors of the reference system 62 and the mirror system 64 has a switch coupled to its source. How closely the output current $I_o$ mimics the reference current $I_R$ is dependent on how closely the transistors in the mirror system 64 are matched with those in the reference system 62.

In some embodiments, the transistors 628, 626, 624, 622, 642, 644 and 646 are arranged in the layout 60-2 in the same order. The transistors 628, 626, 624, 622, 642, 644 and 646 are PD-dependent mismatch elements. Compared to the embodiments described with references to FIGS. 4B-1 and 4B-2, a zone where the transistors of the reference system 62 and the mirror system 64 are the least apart is defined as the inner zone. For example, the transistor 622 and 642 in the inner zone 60A are the least apart from each other. Starting from the inner zone 60A, other zones, such as an intermediate zone 60B in which the transistors 642 and 626 of the reference system 62 and the transistors 644 and 646 are more apart, and an outer zone 60C in which the transistor 628 of the reference system 62 is the furthest apart from the mirror system 64, are defined in an outward manner. In some embodiments, the variability of a relevant model parameter of the transistors in the inner zone 60A is the smallest among the three, and increases in the intermediate zone 60B and further increases in the outer zone 60C.

Figure 7:
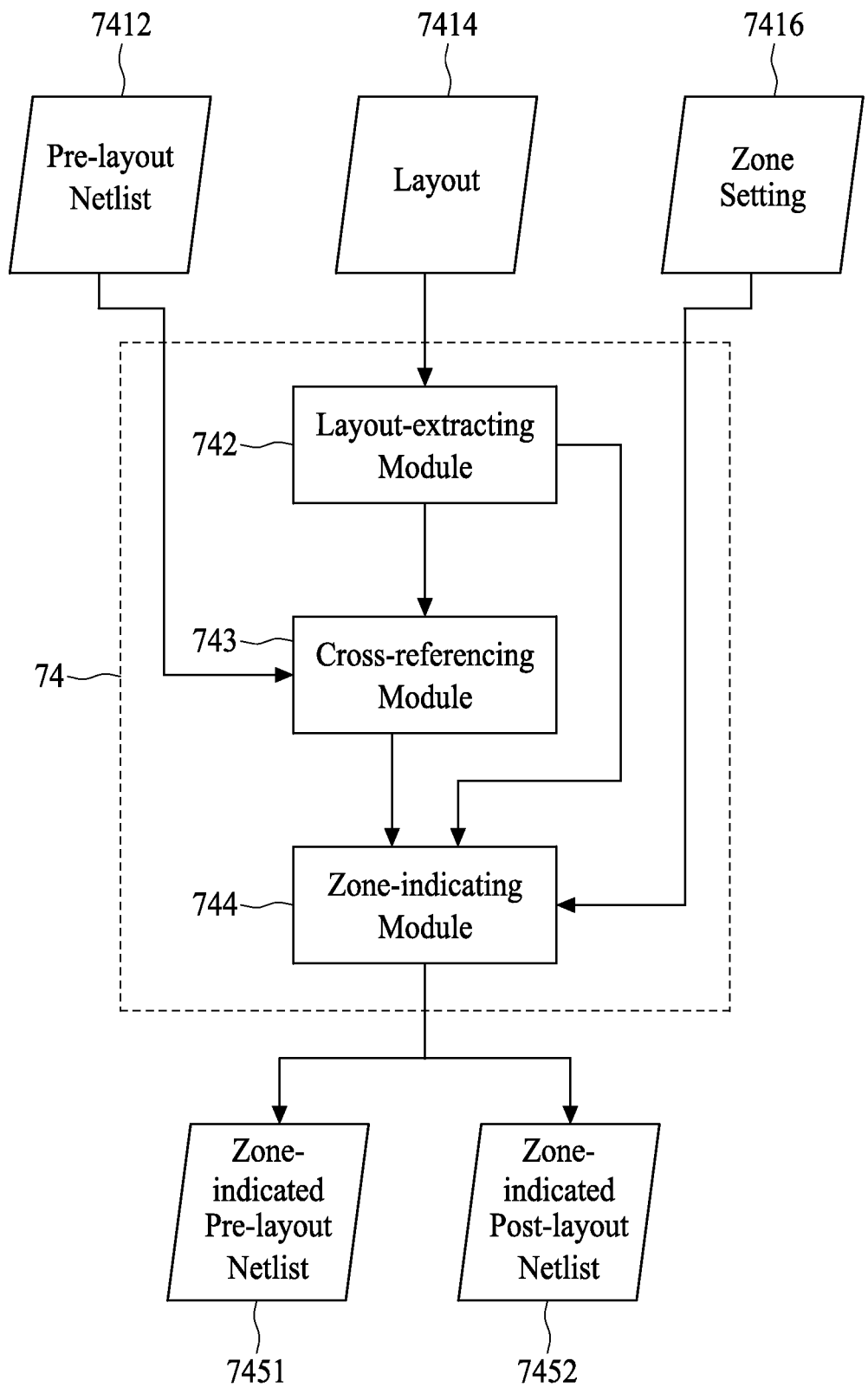
FIG. 7 is a functional block diagram of an LVS tool for generating a netlist with indicated PD-dependent mismatch elements in accordance with other embodiments.

FIG. 7 is a functional block diagram of an LVS tool 74 for generating a netlist with indicated PD-dependent mismatch elements in accordance with other embodiments. Compared to the embodiments described with reference to FIG. 3A, the zone indicated pre-layout netlist 7451 or the zone-indicated post-layout netlist 7452 are directly generated by the LVS tool 74 containing a zone-indicating module 744. The LVS tool 74 is equivalent to the netlist-forming tool 34 in FIG. 3A. In some embodiments, the operations 22 and 24 in FIG. 2 are performed by the LVS tool 74. The LVS tool 74 includes a layout-extracting module 742, a cross-referencing module 743 and a zone-indicating module 744. The layout-extracting module 742 receives the layout 7414 and is configured to extract circuit elements and the connections thereof in the layout 7414 to generate a post-layout netlist. The cross-referencing module 743 receives the pre-layout netlist 7412 and the post-layout netlist from the layout-extracting module 742, and is configured to generate cross-reference information that maps corresponding circuit elements and connections in the pre-layout netlist 7412 and the post-layout netlist generated by the layout-extracting module 742. The zone-indicating module 744 receives a zone setting 7416 and the post-layout netlist from the layout-extracting module 742 and generates the zone-indicated post-layout netlist 7452 based on the zone setting 7416. Further, the zone-indicating module 744 receives the pre-layout netlist 7412 and the cross-reference information from the cross-referencing module 743, and generates the zone-indicated pre-layout netlist 7451 based on the zone setting 7416, location information of the circuit elements in the post-layout netlist 7451, and the cross-reference information.

In the embodiments described with references to FIG. 3A and FIG. 7, the zone setting 3416 or 7416 is used. In other embodiments, the zones can be directly in one of the layers in the layout 3414, such as a marker layer, and is directly extracted by the LVS tool 342 and inserted in the post-layout netlist 3434.

Figure 8:
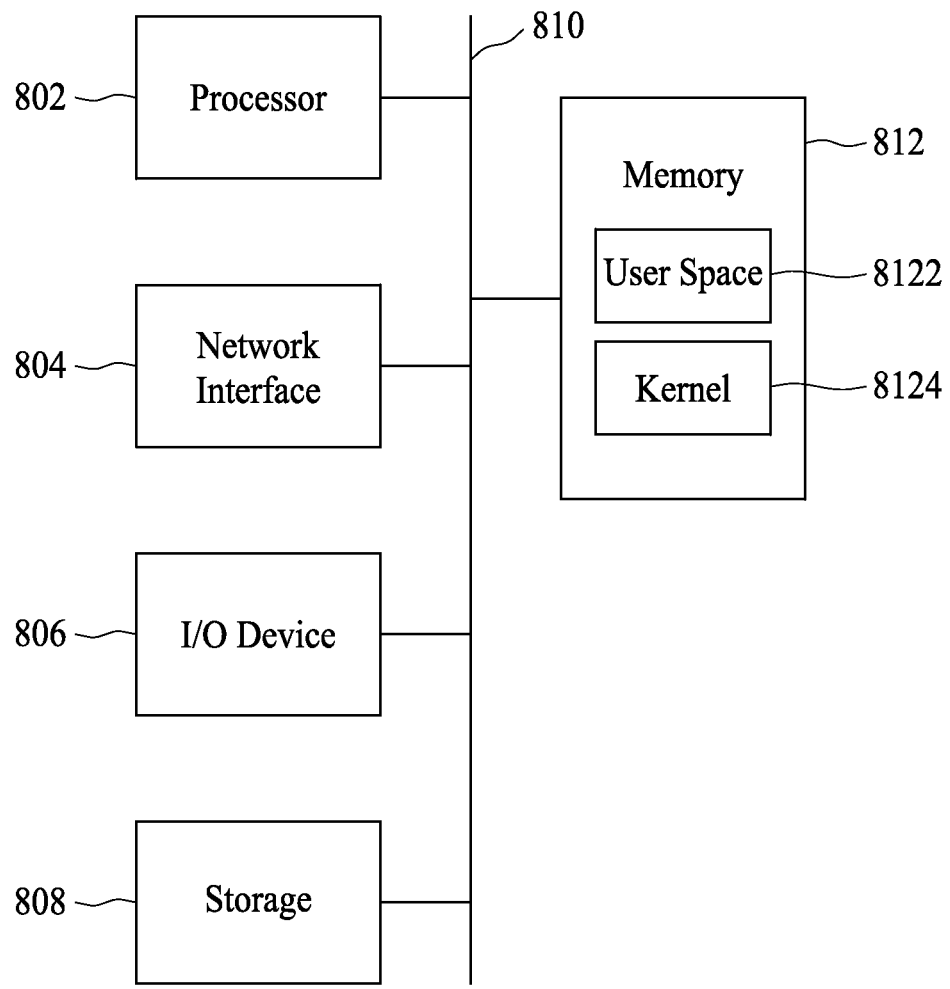
FIG. 8 is a block diagram of a hardware system for implementing the method embodiment described with reference to FIG. 2 and the software system embodiments described with references to FIG. 3A and 7 in accordance with some embodiments.

FIG. 8 is a block diagram of a hardware system 800 for implementing the method embodiment described with reference to FIG. 2 and the software system embodiments described with references to FIG. 3A and 7 in accordance with some embodiments. The system 800 includes at least one processor 802, a network interface 804, an input and output (I/O) device 806, a storage device 808, a memory 812, and a bus 810. The bus 810 couples the network interface 804, the I/O device 806, the storage 808 and the memory 812 to the processor 802.

In some embodiments, the memory 812 comprises a random access memory (RAM) and/or other volatile storage device and/or read only memory (ROM) and/or other non-volatile storage device. The memory 812 includes a kernel 8124 and user space 8122, configured to store program instructions to be executed by the processor 802 and data accessed by the program instructions.

In some embodiments, the network interface 804 is configured to access program instructions and data accessed by the program instructions stored remotely through a network. The I/O device 806 includes an input device and an output device configured for enabling user interaction with the system 800. The input device comprises, for example, a keyboard, a mouse, etc. The output device comprises, for example, a display, a printer, etc. The storage device 808 is configured for storing program instructions and data accessed by the program instructions. The storage device 808 comprises, for example, a magnetic disk and an optical disk.

In some embodiments, when executing the program instructions, the processor 802 is configured to perform the method 20 described with reference to FIG. 2 and as the software system 34 or 74 described with reference to FIG. 3A or 7.

In some embodiments, the program instructions are stored in a non-transitory computer readable recording medium such as one or more optical disks, hard disks and non-volatile memory devices.

Some embodiments have one or a combination of the following features and/or advantages. In some embodiments, the netlist with indicated PD-dependent mismatch elements associated with different PDs, respectively are generated. During a simulation of the netlist, different variabilities are applied to corresponding model parameters of the PD-dependent mismatch elements associated with the different PDs. With the effect of different PDs on the variability of the model parameter taken into consideration, a simulation result is more accurate. Further optimization or subsequent design can therefore be based on the more accurate simulation result.

In some embodiments, in a method performed by at least one processor, a layout of a circuit is received by the at least one processor. A netlist with indicated pattern density (PD)-dependent mismatch elements associated with different PDs, respectively, is generated by the at least one processor using the layout. A simulation on the netlist is performed by the at least one processor such that when the PD-dependent mismatch elements are modeled in the simulation, corresponding model parameters of the PD-dependent mismatch elements are generated using variation distributions with different spreads.

In some embodiments, a system includes at least one processor and at least one memory. The at least one processor is configured to execute program instructions which configure the at least one processor as a netlist-generating tool and a circuit simulation tool. The netlist-generating tool is configured to receive a layout of a circuit, and generate a netlist with indicated pattern density (PD)-dependent mismatch elements associated with different PDs, respectively, using the layout. The circuit simulation tool is configured to perform a simulation on the netlist such that when the PD-dependent mismatch elements are modeled in the simulation, corresponding model parameters of the PD-dependent mismatch elements are generated using variation distributions with different spreads. The at least one memory is configured to store the program instructions.

In some embodiments, in a method performed by at least one processor, a layout of a circuit is received by the at least one processor. A netlist with a plurality of indicated devices in a first zone and a second zone of the layout, respectively, is generated by the at least one processor. The plurality of devices are the same in the layout. The first zone and the second zone have different pattern densities (PDs). The devices in the first zone and the devices in the second zone are indicated differently based on the respective zones. A simulation is performed by the at least one processor on the netlist such that when the devices are modeled in the simulation, the devices in the first zone have corresponding model parameters generated from a first variation distribution with a first spread, and the devices in the second zone have corresponding model parameters generated from a second variation distribution with a second spread. The first spread is different from the second spread.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, performed by at least one processor, comprising:
   receiving, by the at least one processor, a layout of a circuit;
   generating, by the at least one processor using the layout, a netlist with indicated pattern density (PD)-dependent mismatch elements associated with different PDs, respectively; and
   performing, by the at least one processor, a simulation on the netlist such that when the PD-dependent mismatch elements are modeled in the simulation, corresponding model parameters of the PD-dependent mismatch elements are generated using variation distributions with different spreads,
   wherein generating, by the at least one processor, the netlist comprises:
   defining a plurality of zones with the different PDs in the layout; and
   generating the netlist with the indicated PD-dependent mismatch elements in different zones, respectively,
   wherein generating , by the at least one processor, the netlist with the indicated PD-dependent mismatch elements in the different zones comprises:
   generating a post-layout netlist from the layout; and
   back-annotating the PD-dependent mismatch elements in the post-layout netlist with the corresponding zones to generate the netlist with the indicated PD-dependent mismatch elements.

2. The method of claim 1, wherein the PD-dependent mismatch elements in the different zones are indicated by different values of a zone flag.

3. A method, performed by at least one processor, comprising:
   receiving, by the at least one processor, a layout of a circuit;
   generating, by the at least one processor using the layout, a netlist with indicated pattern density (PD)-dependent mismatch elements associated with different PDs, respectively;
   performing, by the at least one processor, a simulation on the netlist such that when the PD-dependent mismatch elements are modeled in the simulation, corresponding model parameters of the PD-dependent mismatch elements are generated using variation distributions with different spreads;
   receiving, by the at least one processor, a pre-layout netlist; and
   generating the netlist with the indicated PD-dependent mismatch elements in the different zones by:
   generating a post-layout netlist from the layout;
   generating cross-reference information using the pre-layout netlist and the post-layout netlist; and
   back-annotating the PD-dependent mismatch elements in the pre-layout netlist with the corresponding zones using the post-layout netlist and the cross-reference information to generate the netlist with the indicated PD-dependent mismatch elements.

4. The method of claim 1, wherein the circuit is an array circuit, and generating, by the at least one processor, the netlist with the indicated PD-dependent mismatch elements comprises:
   defining a plurality of zones with the different PDs in the layout of the array circuit;
   the plurality of zones comprising a first zone along edges of the layout, and a second zone surrounded by the first zone; and
   generating the netlist with the indicated PD-dependent mismatch elements in the first zone and the second zone, respectively.

5. The method of claim 4, wherein the simulation is performed on the netlist such that when the PD-dependent mismatch elements are modeled in the simulation, the model parameter of the PD-dependent mismatch element in the first zone is generated using the variation distribution with a first spread, and the model parameter of the PD-dependent mismatch element in the second zone is generated using the variation distribution with a second spread,
   the first spread of variation distribution being larger than the second spread of variation distribution.

6. A system, comprising:
   at least one processor, configured to execute program instructions which configure the at least one processor as:
   a netlist-generating tool, configured to:
   receive a layout of a circuit; and
   generate a netlist with indicated pattern density (PD)-dependent mismatch elements associated with different PDs, respectively, using the layout; and
   a circuit simulation tool, configured to perform a simulation on the netlist such that when the PD-dependent mismatch elements are modeled in the simulation, corresponding model parameters of the PD-dependent mismatch elements are generated using variation distributions with different spreads; and
   at least one memory configured to store the program instructions,
   wherein the netlist-generating tool is configured to generate the netlist with the indicated PD-dependent mismatch elements by performing operations comprising:
   defining a plurality of zones with the different PDs in the layout; and
   generating the netlist with the indicated PD-dependent mismatch elements in different zones, respectively, and
   wherein the netlist-generating tool comprises:
   a layout-versus-schematic (LVS) tool configured to generate a post-layout netlist from the layout; and
   a zone-indicating utility configured to back-annotate the PD-dependent mismatch elements in the post-layout netlist with the corresponding zones to generate the netlist with the indicated PD-dependent mismatch elements.

7. The system of Claim 6, wherein the PD-dependent mismatch elements in the different zones are indicated by different values of a zone flag.

8. A system, comprising:
   at least one processor, configured to execute program instructions which configure the at least one processor as:
   a netlist-generating tool, configured to:
   receive a layout of a circuit; and
   generate a netlist with indicated pattern density (PD)-dependent mismatch elements associated with different PDs, respectively, using the layout; and
   a circuit simulation tool, configured to perform a simulation on the netlist such that when the PD-dependent mismatch elements are modeled in the simulation, corresponding model parameters of the PD-dependent mismatch elements are generated using variation distributions with different spreads; and
   at least one memory configured to store the program instructions;
   wherein the netlist-generating tool comprises:
   an LVS tool configured to receive a pre-layout netlist and the layout, and generate a post-layout netlist from the layout, and cross-reference information from the pre-layout netlist and the post-layout netlist; and
   a zone-indicating utility configured to back-annotate the PD-dependent mismatch elements in the pre-layout netlist with the corresponding zones using the post-layout netlist and the cross-reference information to generate the netlist with the indicated PD-dependent mismatch elements.

9. The system of claim 6, wherein the circuit is an array circuit, and the netlist-generating module is configured to generate the netlist with indicated PD-dependent mismatch elements by performing operations comprising:
   defining a plurality of zones with the different PDs in the layout of the array circuit;
   the plurality of zones comprising a first zone along edges of the layout, and a second zone surrounded by the first zone; and
   generating the netlist with the indicated PD-dependent mismatch elements in the first zone and the second zone, respectively.

10. The system of claim 9, wherein the circuit simulation tool is configured to perform the simulation on the netlist such that when the PD-dependent mismatch elements are modeled in the simulation, the model parameter of the PD-dependent mismatch element in the first zone is generated using the variation distribution with a first spread, and the model parameter of the PD-dependent mismatch element in the second zone is generated using the variation distribution with a second spread,
   the first spread of variation distribution being larger than the second spread of variation distribution.

11. A method performed by at least one processor, comprising:
   receiving, by the at least one processor, a layout of a circuit;
   generating, by the at least one processor, a netlist with a plurality of indicated devices in a first zone and a second zone of the layout, respectively,
   the plurality of devices being the same in the layout,
   the first zone and the second zone having different pattern densities (PDs), and
   the devices in the first zone and the devices in the second zone are indicated differently based on the respective zones; and
   performing, by the at least one processor, a simulation on the netlist such that when the devices are modeled in the simulation, the devices in the first zone have corresponding model parameters generated from a first variation distribution with a first spread, and the devices in the second zone have corresponding model parameters generated from a second variation distribution with a second spread,
   the first spread being different from the second spread,
   wherein generating, by the at least one processor, the netlist with the plurality of indicated devices in the first zone and the second zone comprises:
   generating a post-layout netlist from the layout; and
   back-annotating the devices in the first zone and the devices in the second zone in the post-layout netlist with the corresponding zones to generate the netlist with the plurality of indicated devices in the first zone and the second zone.

12. The method of claim 11, wherein the devices in the first zone and the devices in the second zone are indicated differently by different values of a zone flag.

13. A method performed by at least one processor, comprising:
   receiving, by the at least one processor, a layout of a circuit;
   generating, by the at least one processor, a netlist with a plurality of indicated devices in a first zone and a second zone of the layout, respectively,
   the plurality of devices being the same in the layout,
   the first zone and the second zone having different pattern densities (PDs), and
   the devices in the first zone and the devices in the second zone are indicated differently based on the respective zones; and
   performing, by the at least one processor, a simulation on the netlist such that when the devices are modeled in the simulation, the devices in the first zone have corresponding model parameters generated from a first variation distribution with a first spread, and the devices in the second zone have corresponding model parameters generated from a second variation distribution with a second spread,
   the first spread being different from the second spread
   receiving, by the at least one processor, a pre-layout netlist; and
   generating, by the at least one processor, the netlist with the plurality of indicated devices in the first zone and the second zone by:
   generating a post-layout netlist from the layout;
   generating cross-reference information using the pre-layout netlist and the post-layout netlist; and
   back-annotating the devices in the first zone and the devices in the second zone in the pre-layout netlist with the corresponding zones to generate the netlist with the indicated PD-dependent mismatch elements.

14. The method of claim 11, wherein
   the circuit is an array circuit; and
   the first zone is along edges of the layout, and the second zone is surrounded by the first zone.

15. The method of claim 14, wherein the first spread of variation distribution is smaller than the second spread of variation distribution.

* * * * *